(12) United States Patent
Peschke et al.

(10) Patent No.: US 8,791,689 B2
(45) Date of Patent: Jul. 29, 2014

(54) OSCILLOSCOPE PROBE

(75) Inventors: Martin Peschke, Munich (DE); Alexander Schild, Feldkirchen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 342 days.

(21) Appl. No.: 12/376,963

(22) PCT Filed: Jul. 16, 2007

(86) PCT No.: PCT/EP2007/006298
§ 371 (c)(1),
(2), (4) Date: Feb. 9, 2009

(87) PCT Pub. No.: WO2008/019740
PCT Pub. Date: Feb. 21, 2008

(65) Prior Publication Data
US 2010/0176795 A1    Jul. 15, 2010

(30) Foreign Application Priority Data
Aug. 14, 2006 (DE) .......... 10 2006 038 028
Nov. 8, 2006 (DE) .......... 10 2006 052 720

(51) Int. Cl.
*G01R 13/20* (2006.01)
*G01R 13/22* (2006.01)
*G01R 13/34* (2006.01)
G01R 1/067 (2006.01)
G01R 1/06 (2006.01)
G01R 31/02 (2006.01)

(52) U.S. Cl.
CPC .............. *G01R 13/20* (2013.01); *G01R 13/22* (2013.01); *G01R 13/34* (2013.01); *G01R 1/067* (2013.01); *G01R 1/06* (2013.01); *G01R 31/02* (2013.01)

USPC ............. 324/121 R; 324/754.01; 324/754.02; 324/76.19; 324/76.24; 702/66; 702/65; 702/67; 702/68; 702/69; 702/70; 702/71; 702/72; 702/73; 702/74; 702/75; 702/76; 330/302; 333/32

(58) Field of Classification Search
CPC .......... G01R 13/20; G01R 1/067; G01R 1/06; G01R 31/02; G01R 13/22; G01R 13/34
USPC .......................... 324/754.01, 754.02, 121 R, 324/76.19–76.24; 702/66–76; 333/32; 330/302
See application file for complete search history.

(56) References Cited

U.S. PATENT DOCUMENTS 3,444,476 A * 5/1969 Leidich ............................. 330/69
3,701,909 A * 10/1972 Holmes et al. ................... 327/95

(Continued)

OTHER PUBLICATIONS

Transistor_Darlington_Pair; web site: radio-electronics.com/info/circuits/transistor/darlington-pair-amplifier.php, pp. 2-5.*

(Continued)

*Primary Examiner* — Patrick Assouad
*Assistant Examiner* — Lamarr Brown
(74) *Attorney, Agent, or Firm* — Christensen O'Connor Johnson Kindness PLLC

(57) ABSTRACT

Disclosed is a probe for an oscilloscope comprising a multi-stage transistor amplifier that acts as an impedance transformer. Said amplifier is a d.c.-coupled emitter follower circuit that is composed of bipolar transistors or a d.c.-coupled source follower circuit which is composed of field effect transistors and the successive amplifier elements of which are dimensioned and tuned to each other in such a way that the resulting offset direct voltage between the input and the output is minimal.

17 Claims, 4 Drawing Sheets

(56) References Cited

U.S. PATENT DOCUMENTS

| | | | |
|---|---|---|---|
| 3,719,833 A * | 3/1973 | Free | 327/538 |
| 3,721,914 A * | 3/1973 | Nakamura | 330/259 |
| 3,731,215 A * | 5/1973 | Peil et al. | 330/254 |
| 3,832,645 A * | 8/1974 | Greutman | 330/283 |
| 3,906,344 A | 9/1975 | Addis | |
| 4,024,462 A * | 5/1977 | Highnote et al. | 330/259 |
| 4,123,674 A * | 10/1978 | Comiskey et al. | 327/58 |
| 4,460,873 A * | 7/1984 | Hester | 330/259 |
| 4,498,058 A | 2/1985 | Benrud | |
| 4,523,161 A * | 6/1985 | Miles | 333/81 R |
| 4,646,002 A | 2/1987 | Tuszyski | |
| 4,684,886 A * | 8/1987 | Doyle | 324/132 |
| 4,803,423 A | 2/1989 | Boutigny | |
| 5,111,065 A * | 5/1992 | Roberge | 327/109 |
| 5,225,776 A * | 7/1993 | Dobos et al. | 324/121 R |
| 5,270,660 A * | 12/1993 | Werner et al. | 324/457 |
| 5,384,532 A | 1/1995 | Uhling | |
| 5,457,425 A * | 10/1995 | Tahara | 330/51 |
| 5,488,301 A * | 1/1996 | Werner et al. | 324/458 |
| 5,602,483 A | 2/1997 | Uhling | |
| 5,654,669 A | 8/1997 | Uhling | |
| 5,891,048 A * | 4/1999 | Nigam et al. | 600/521 |
| 5,929,617 A * | 7/1999 | Brokaw | 323/280 |
| 6,016,050 A * | 1/2000 | Brokaw | 323/315 |
| 6,870,359 B1 | 3/2005 | Sekel | |
| 8,581,611 B2 * | 11/2013 | Peschke et al. | 324/754.01 |
| 2003/0234684 A1 * | 12/2003 | Oppelt | 330/85 |
| 2004/0207384 A1 * | 10/2004 | Brederlow et al. | 324/71.5 |
| 2005/0195675 A1 * | 9/2005 | Yamamoto et al. | 365/229 |
| 2006/0214720 A1 * | 9/2006 | Sobue | 327/359 |
| 2008/0297966 A1 * | 12/2008 | Gomez et al. | 361/93.7 |
| 2011/0006793 A1 * | 1/2011 | Peschke et al. | 324/754.01 |

OTHER PUBLICATIONS

Cunningham et al., "Basic Circuit Analysis", Houghton Mifflin Company, 1991, p. 23-26.*

International Preliminary Report on Patentability mailed Mar. 19, 2009, issued in corresponding Application No. PCT/EP2007/006298, filed Jul. 16, 2007.

* cited by examiner

OSCILLOSCOPE PROBE

The invention relates to a probe for an oscilloscope according to the preamble of the independent claim.

With active oscilloscope probes for the measurement of earth-referenced signals, the probe tip, which picks up the signal to be measured with a high-resistance, is connected to an amplifier acting as an impedance converter, of which the output provides a characteristic impedance of generally 50Ω. The measured signal is supplied from the output of this amplifier via a high-frequency cable to the input of the oscilloscope, which terminates the cable with its characteristic impedance of, for example, 50Ω in order to avoid reflections.

Amplifiers of this kind generally provide a so-called direct-voltage offset error, that is to say, an input voltage of 0 volts does not correspond exactly with an output voltage of 0 volts. The use of cost-intensive amplifier topologies is known as a means of minimising this error. For example, in the case of an earth-referenced probe with a large bandwidth, U.S. Pat. No. 5,384,532 discloses the use of an amplifier as an impedance converter, which is constructed as a composite amplifier, consisting of a high-frequency path for high-frequencies and a low-frequency path for low-frequencies and direct voltages. The amplifier in the low-frequency path in this context is an operational amplifier with the smallest possible offset. The high-frequency path for high frequencies of, for example, more than 10 MHz consists of a three-stage emitter-follower with transistors of the npn type, and is designed as an AC-coupled amplifier with a separating capacitor disposed between the probe tip and the input of the amplifier.

This known arrangement is also associated with various disadvantages. For example, transfer distortions are likely with frequencies reaching the output via both paths. With reference to the operational amplifier, a compromise must be achieved between the bandwidth of the low-frequency path, the input capacitance and the smallest possible offset. This is difficult to achieve in practice. Moreover, the input impedance, the input capacitance and the input current of the low-frequency path impair the characteristic data of the probe.

The object of the invention is to provide an oscilloscope probe, of which the amplifier provides a simple structure but the same time achieves a minimal direct-voltage-offset error.

This object is achieved on the basis of a probe as specified in the preamble of the independent claim by its characterising features. Advantageous further developments of the amplifier used and with regard to the compensation of any remaining residual offset error are specified in the dependent claims.

According to the invention, by contrast with the prior art, a DC-coupled transistor amplifier is used, which is constructed from bipolar transistors in an emitter-follower circuit, from field-effect transistors in a source-follower circuit or from a combination of both of these circuit types. In this context, the amplifier topology used is selected in such a manner that the sum of successive offset-direct voltages of the individual amplifier elements is cancelled out thereby achieving a total amplifier offset error of practically 0 volts.

In spite of this measure according to the invention, a small offset between the amplifier input and the amplifier output still remains in practice. However, this is sufficiently small to be tolerated by the oscilloscope input. Using appropriate circuit measures, it is possible to make the offset independent of the temperature and ageing of the circuit. The offset can be determined through a calibration measurement and taken into consideration accordingly in the oscilloscope. The calibration measurement can also be implemented automatically, by providing an earthing circuit at the input of the amplifier, that is to say, the amplifier input is automatically connected to earth, for example, by a switch.

Another possibility is to measure and compensate the offset in parallel with the amplifier, wherein either a direct compensation is implemented by regulation within the amplifier itself, or the offset, measured either in the amplifier or only in the oscilloscope, is tolerated, left uncompensated, and only taken into consideration in the subsequent evaluation of a measured value in the oscilloscope.

The invention is explained in greater detail below with reference to schematic drawings of exemplary embodiments. The drawings are as follows.

Figure 1:
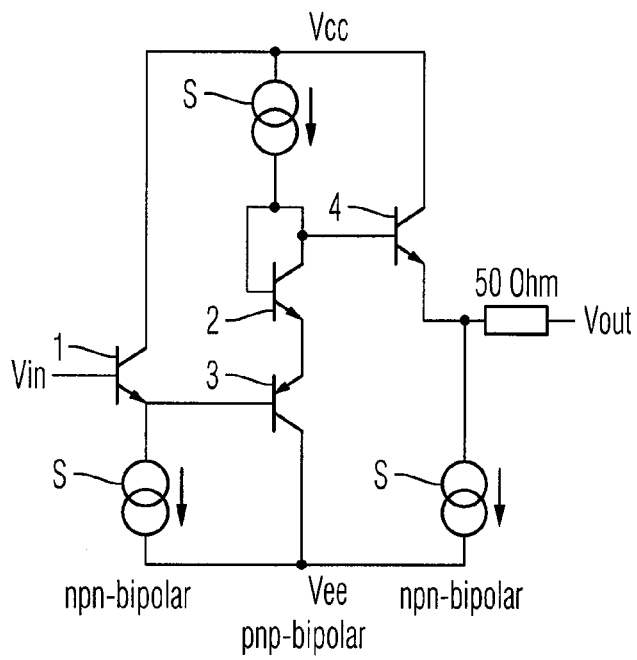
FIGS. 1-5 show possible exemplary embodiments of a DC-coupled amplifier according to the invention constructed of bipolar transistors in an emitter-follower circuit, self-conducting field-effect transistors in a source-follower circuit or a mixture of both of these possible circuits, optionally with the addition of diodes or resistors.

FIG. 1 shows a DC-coupled amplifier consisting of three bipolar transistors 1, 3 and 4 operated in an emitter-circuit with the addition of a fourth bipolar transistor 2 connected as a diode for voltage offset. The input transistor 1, to which the input voltage $V_{in}$ is supplied from the probe tip of the probe, is of the npn type; the following transistor 3 is of the pnp type and the output transistor 4 is once again of the npn type. The adjustment of the operating points of the transistors is implemented via the power sources S. The base-emitter voltage of the transistors 1 and 4 in the example is +0.8 volts, that of transistor 3 and the rectified voltage of the diode 2 is −0.8 volts. This leads to an offset direct voltage of approximately 0 volts.

Figure 2:
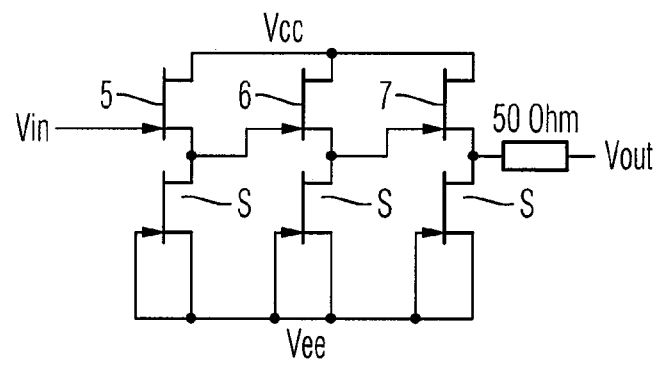

In the case of the self-conducting source-follower circuit according to FIG. 2 constructed of JFET or HEMT field-effect transistors 5, 6 and 7, the source current is selected in such a manner that the gate-source voltage $U_{gs}$ is 0 volts. This is possible, for example, using paired field-effect transistors as power sources S, of which the gate-source voltage is set to 0 volts. With this circuit according to FIG. 2, an offset of approximately 0 volts is therefore also achieved between the input and the output.

Figure 3:
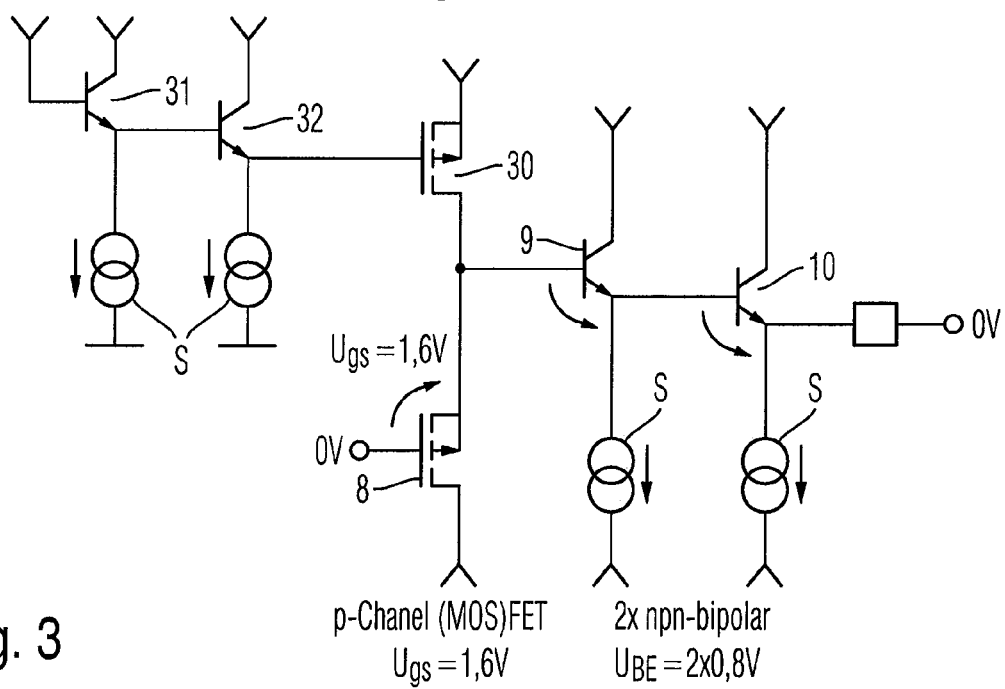

FIG. 3 shows a DC-coupled amplifier consisting of a MOSFET transistor 8 of the p-channel type, which provides a gate-source voltage of approximately 1.6 volts, followed by two bipolar npn transistors 9 and 10 disposed in an emitter-follower circuit, which together provide a base-emitter voltage of −1.6 volts. An offset of approximately 0 volts is therefore also achieved here. The adjustment of the gate-source voltage matched to the base-emitter voltages of the npn transistors is implemented via a further p-channel MOSFET 31 as a power source, of which the gate-source voltage is specified by two npn-base-emitter paths 31, 32.

Figure 4:
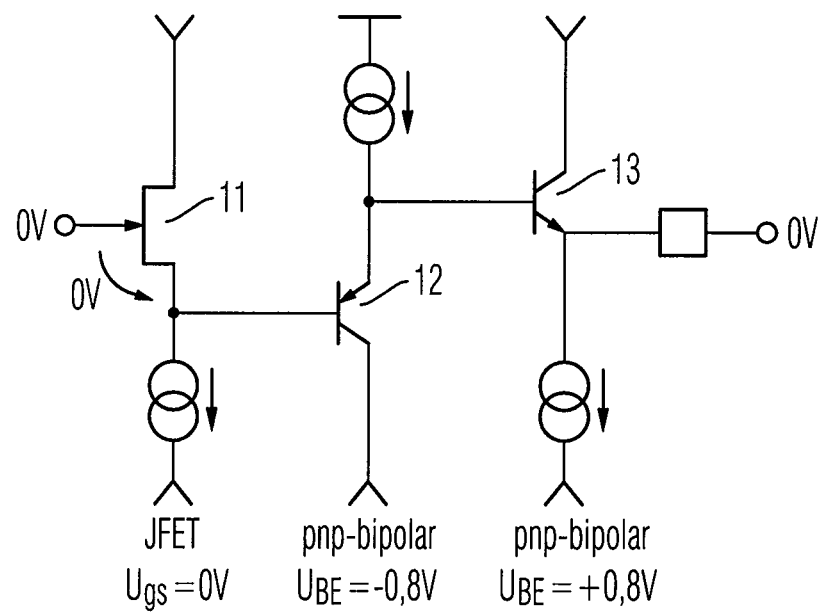

As shown in FIG. 4, a JFET field-effect transistor 11 is connected together with two bipolar transistors 12 and 13 in each case of a different conductor type; here also, a total offset of approximately 0 volts is achieved.

Figure 5:
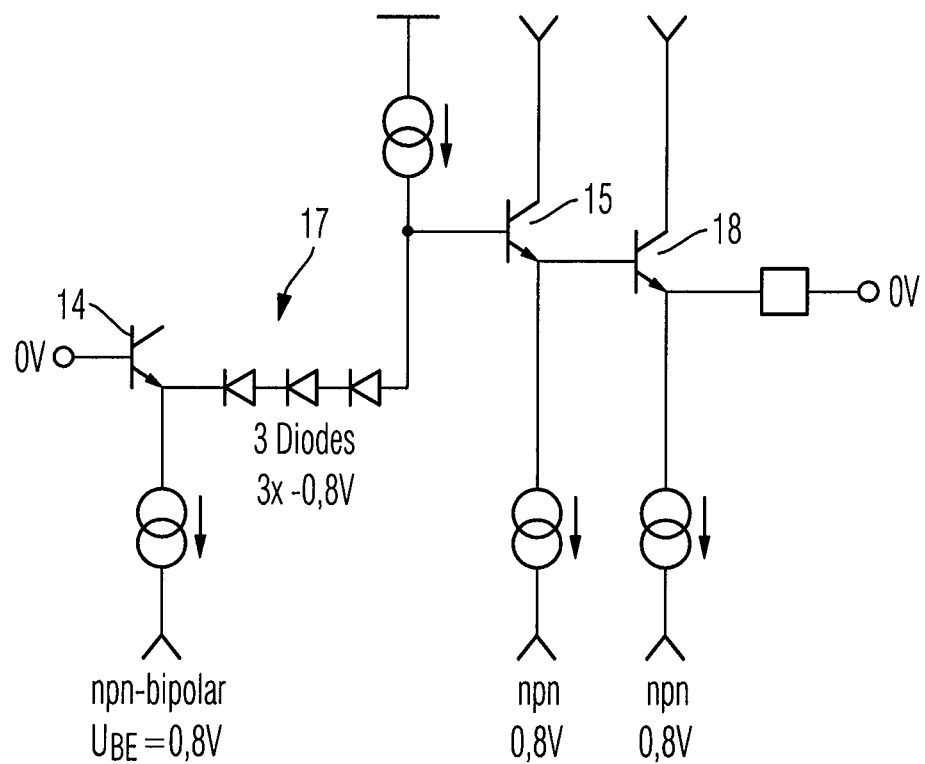

Finally, FIG. 5 shows the combination of bipolar transistors 14 to 16 of the same (npn) conductivity type with three diodes 17. The sequence of the base-emitter voltages with the rectified voltages of the diodes once again achieves an offset of approximately 0 volts.

Figure 6:
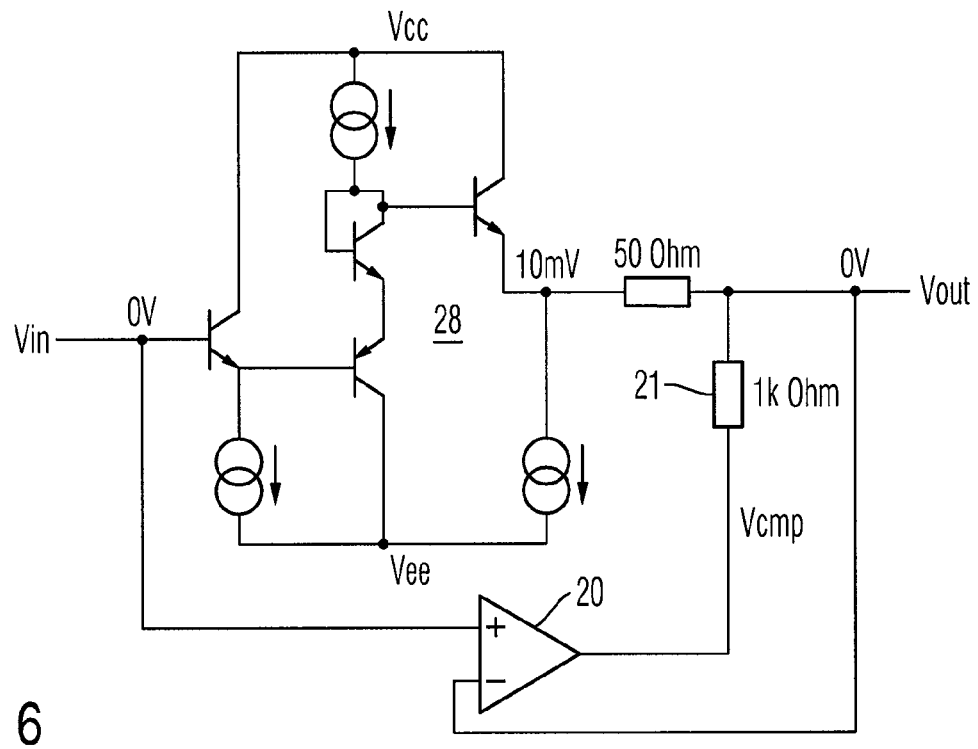
FIGS. 6 and 7 show the possibility of direct compensation of a residual offset in the amplifier itself.
Figure 7:
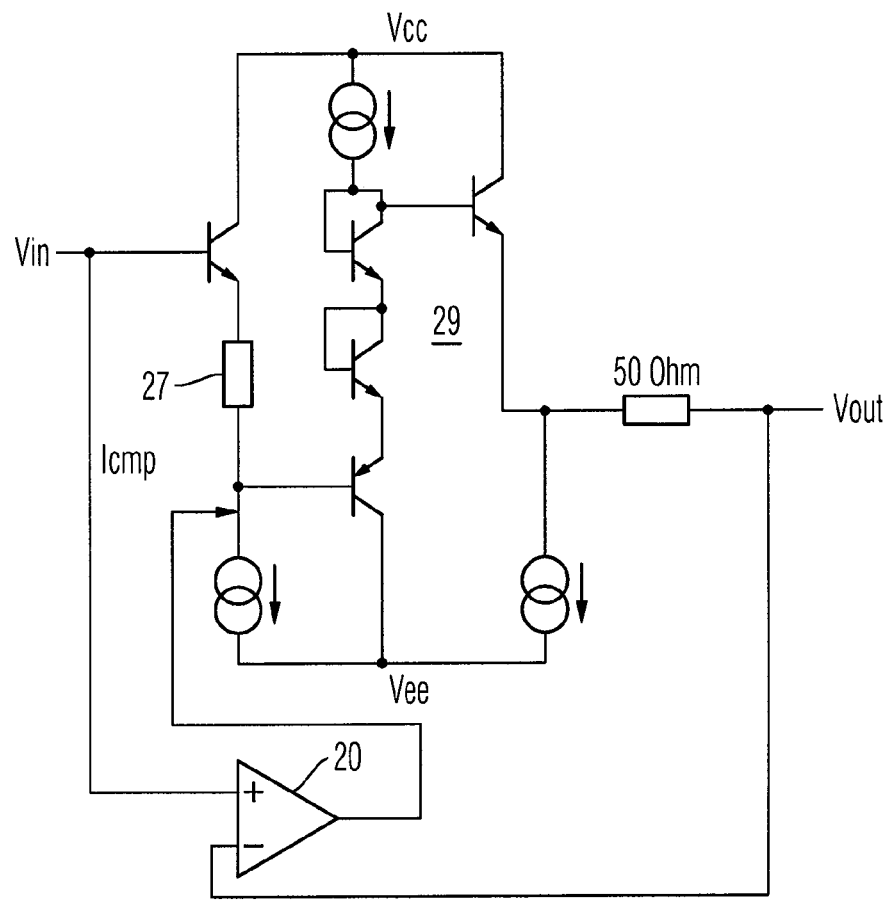

Any potentially-remaining residual offset in these various DC-coupled transistor amplifiers can be compensated directly in the amplifier itself as shown in FIGS. 6 and respectively 7. In FIG. 6 the input voltage $V_{in}$ of the amplifier 28 is compared in an operational amplifier 20 with the output voltage $V_{out}$, and in this manner any existing residual offset of the amplifier 28 is measured. This is then supplied directly as a compensation voltage via a resistor 21 to the output of the amplifier 28 and therefore compensates the residual offset. In the exemplary embodiment shown in FIG. 7, a compensation current is generated from the measured offset of the amplifier 29, with which the current is regulated directly through the resistor 27 in such a manner that the residual offset of the amplifier 29 is compensated.

An input divider, which is connected between the probe tip and the amplifier input $V_{in}$, can also be disposed in the probe in front of the amplifier. The measurement of the offset voltage for the compensation in this case is then picked up as an input voltage either before or after the input divider.

All of the elements of the probe according to the invention such as the amplifier, circuit for offset measurement, input divider and similar can be constructed as a hybrid on a substrate. Accordingly, the divider can be constructed, for example, using thin-layer technology or thick-layer technology. The amplifier can be designed as a bipolar IC. It is also conceivable to construct the input divider in monolithic integration on a chip together with the amplifier and the circuit for offset measurement.

Figure 8:
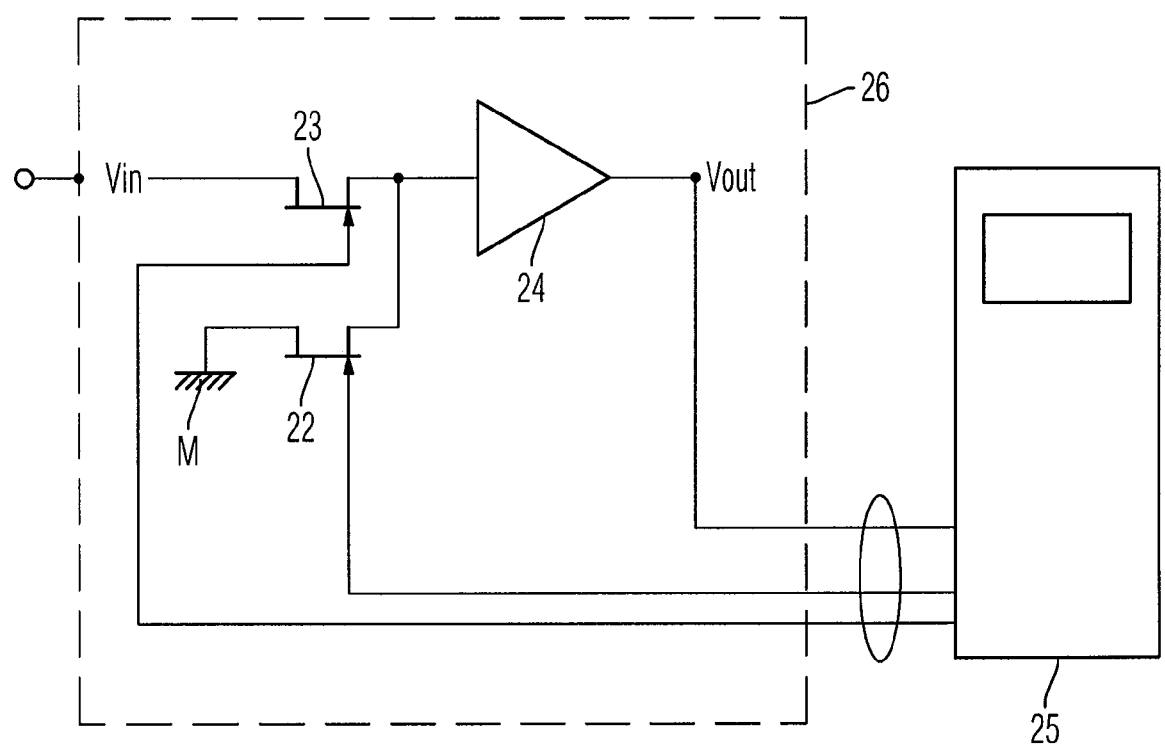
FIG. 8 shows a possibility for measuring the offset voltage in the oscilloscope and taking this into consideration in the evaluation of the measured voltage.

FIG. 8 shows one possibility for measuring the offset by means of an electronic switch 22 controlled remotely from the oscilloscope, by means of which the input of the DC-coupled amplifier 24 can be connected to earth M with the input of the amplifier 24 isolated from the probe via the electronic switch 23, so that the offset of the amplifier 24 is measured directly in the oscilloscope 25 instead of the measured voltage. This value can then be taken into consideration in the subsequent evaluation of a measured value in the oscilloscope 25, wherein the switch 23 is closed again, and switch 22 is opened. This kind of measurement of the offset provides the additional advantage that any potential offsets of the amplifier circuits can be taken into consideration in the oscilloscope itself, dependent upon the position of the amplifier circuit in the oscilloscope acting as a whole between the probe and the display device of the oscilloscope, at which the offset is measured.

The invention is not restricted to the exemplary embodiment illustrated. All of the features described and illustrated can be combined with one another as required within the framework of the invention.

The invention claimed is:

1. Probe for an oscilloscope comprising:
a multi-stage transistor amplifier acting as an impedance converter, of which the output is connected to the oscilloscope,
wherein the amplifier includes a mixture of amplifier elements selected from the group consisting of bipolar transistors, field-effect transistors, diodes and resistors, which amplifier elements are dimensioned and matched to one another in such a manner that the sum of the voltages between the input and the output of the amplifier of said mixture of amplifier elements is 0 volts or approximately 0 volts.

2. Probe according to claim 1, wherein
the amplifier includes transistors mixed with intermediate diodes that are connected in such a manner that an offset direct voltage is 0 volts or approximately 0 volts.

3. Probe according to claim 1, wherein
the amplifier is an emitter-follower circuit constructed from several bipolar transistors, and the successive transistors are selected from a mixture of npn and pnp bipolar transistors in such a manner that the sum of the successive base-emitter voltages is 0 volts or approximately 0 volts.

4. Probe according to claim 1, wherein
the amplifier is a source-follower circuit comprised of several field-effect transistors, of which the source currents are selected in such a manner that the gate-source voltages of the individual transistors and therefore also their sum is approximately 0 volts.

5. Probe according to claim 1, further comprising
a circuit connected to the input and output of the amplifier for measuring an offset and for generating a compensation value corresponding to the output of the amplifier and allocated to the amplifier, with which compensation value the offset is compensated directly in the amplifier by a compensation circuit allocated to the amplifier.

6. Probe according to claim 5, wherein
the offset is measured by an operational amplifier comparing the input voltage and output voltage of the amplifier.

7. Probe according to claim 5, wherein
the compensation value is supplied directly to the output of the amplifier as a compensation voltage for the compensation of the offset.

8. Probe according to claim 5, wherein
the compensation value is supplied to the bias-current of one of the successive amplification elements of the amplifier as a compensation current for the compensation of the offset.

9. Probe according to claim 1, further comprising
a circuit connected to the input and output of the amplifier for measuring an offset and for generating a compensation value corresponding to the output of the amplifier and allocated to the amplifier, which compensation value is provided via an additional conductor to the oscilloscope for the compensation of the offset in the oscilloscope.

10. Probe according to claim 9, wherein
the sum is measured by an operational amplifier comparing the input and output voltage of the amplifier.

11. Probe according to claim 9, wherein
the measured offset is provided to the oscilloscope in digital form and taken into consideration in the evaluation of the measured voltage in the oscilloscope.

12. Probe according to claim 1, wherein
a switching device capable of being controlled remotely or operated manually via the oscilloscope is allocated to the input of the amplifier, by which an earth potential can be connected to the amplifier input instead of the measured voltage of the probe tip, and accordingly, with the amplifier input connected to earth, the direct-voltage offset is measured in the oscilloscope and taken into consideration in the evaluation of the measured voltage in the oscilloscope.

13. Probe according to claim 1, wherein
an input-voltage divider is connected upstream of the amplifier.

14. Probe according to claim 1, wherein
the amplifier includes a p-channel MOSFET transistor followed by two bipolar npn transistors operated in an emitter-follower circuit.

15. Probe according to claim 14, wherein
the adjustment of the gate-source voltage of the MOSFET transistor is implemented to match the base-emitter voltages of the npn transistors via a p-channel MOSFET transistor, of which the gate-source voltage is specified by two npn-base-emitter paths.

16. Probe according to claim 1, wherein the amplifier includes transistors mixed with resistors that are connected in such a manner that an offset direct voltage is 0 volts or approximately 0 volts.

17. Probe according to claim 1, wherein the amplifier includes transistors mixed with intermediate diodes and resistors that are connected in such a manner that an offset direct voltage is 0 volts or approximately 0 volts.

* * * * *